US006817255B2

(12) United States Patent
Haque et al.

(10) Patent No.: US 6,817,255 B2
(45) Date of Patent: Nov. 16, 2004

(54) APPARATUS AND METHOD FOR TESTING OF MICROSCALE TO NANOSCALE THIN FILMS

(75) Inventors: Amanul Haque, Champaign, IL (US); Muhammed Taher Abu Saif, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 60 days.

(21) Appl. No.: 10/241,748

(22) Filed: Sep. 11, 2002

(65) Prior Publication Data

US 2003/0057993 A1 Mar. 27, 2003

Related U.S. Application Data (60) Provisional application No. 60/318,817, filed on Sep. 12, 2001.

(51) Int. Cl.[7] .................................................. G01L 1/04

(52) U.S. Cl. ..................................... 73/862.638; 73/626

(58) Field of Search ..................... 73/862.638–862.643, 73/826, 777, 514.32, 0.38

(56) References Cited

U.S. PATENT DOCUMENTS

| | | | |
|---|---|---|---|
| 4,784,720 A | 11/1988 | Douglas | 156/643 |
| 4,855,017 A | 8/1989 | Douglas | 156/643 |
| 5,501,893 A | 3/1996 | Laermer et al. | 428/161 |
| 6,170,332 B1 * | 1/2001 | MacDonald et al. | 73/514.38 |
| 6,230,571 B1 * | 5/2001 | Kimerer, Jr. | 73/862.638 |
| 6,240,782 B1 * | 6/2001 | Kato et al. | 73/514.32 |
| 6,606,913 B1 * | 8/2003 | Gianchandani | 73/777 |

FOREIGN PATENT DOCUMENTS

DE 4241045 C1 5/1994

OTHER PUBLICATIONS

David T. Read, "Piezo–Actuated Microtensile Test Apparatus", American Society for Testing and Materials, vol. 26, No. 3, 1998, pp. 255–259.

Brotzen, F.R., "Mechanical Testing of Thin Films", International Materials Reviews, vol. 39, No. 1, pp. 24–45, 1994.

Nix, W.D., "Mechanical Properties of Thin Films", Metallurgical Transactions, vol. 20A, p. 2217, 1989.

Kang, Y.S., and P.S. Ho., "Thickness Dependent Mechanical Behavior of Submicron Aluminum Films", Journal of Electronic Materials, vol. 26, No. 7, pp. 805–813, 1997.

Huang, H., and Spaepen, F., "Tensite Testing of Free–Standing Cu, Ag and Al Thin Films and Ag/Cu Multilayers", Acta Materialia, vol. 48, No. 12, pp. 3261–3269, 2000.

Yuan, B., and W.N. Sharpe, "Mechanical Testing of Polysilicon Thin Films", Experimental Mechanics, pp. 32–35, Mar./Apr., 1997.

Greek, S., F. Ericson, S. Johansson, and J.A. Schweitz, "Micromechanical Tensile Testing", Materials Research Society Symposium Proceedings, vol. 436, pp. 227–232, 1997.

Haque, M.A., and Saif, M.T.A., "Microscale Materials Testing Using MEMS Actuators", Journal of Microelectromechanical Systems, vol. 10, No. 1, Mar. 2001, pp. 146–152.

(List continued on next page.)

Primary Examiner—Harshad Patel
Assistant Examiner—Alandra Ellington
(74) Attorney, Agent, or Firm—Greer, Burns & Crain, Ltd.

(57) ABSTRACT

Apparatus and method for testing a thin film material. A chip is fabricated that includes the specimen to be tested, held by a force sensor beam at a first longitudinal end and by a support structure at a second longitudinal end. The chip is configured to be placed into a testing environment for quantitative and qualitative material property testing of the specimen. Methods are also provided for fabricating a testing chip.

37 Claims, 4 Drawing Sheets-

OTHER PUBLICATIONS

Behr, R., J. Mayer, and E. Arzt, "TEM Investigation of the Superdislocations and their Interaction with Particles in Dispersion Stengthened Intermetallics", Intermetallics, 7, pp. 423–436, 1999.

Robertson, I.M., T.C. Lee, and H.K. Brinbaum, "Application of In–Situ TEM Deformation Techniques to Observe how 'Clean' and Doped Grain Boundaries Respond to Local Stress Concentrations", Ultramicroscopy, vol. 40, pp. 330–338, 1992.

Spaepen, F., and A. Shull, "Mechanical Properties of Thin Films & Multilayers", Current Opinion in Solid State and Materials Science, 1: 679–683, 1996.

Sanders, P.G., J.A. Eastman, and J.R. Weertman, "Elastic and Tensile Behavior of Nanocrystalline Copper and Palladium", Acta Materialia, vol. 45, No. 10, pp. 4019–4025, 1997.

Chechenin, N.G., J. Botigger, and J.P. Krog, "Nanoindentation of Amorphous Aluminum Oxide Films III. The Influence of the Substrate on the Elastic Properties", Thin Solid Films, 304, pp. 70–77, 1997.

Kè, T.S., and C.M. Zener, "Structure of Cold–Worked Metals as Deduced from Anelastic Measurements", Symposium on Plastic Deformation of Crystalline Solids, Mellon Institute, Pittsburgh, pp. 185–192, 1950.

Gibeling, J.C., and W.D. Nix. "Observations of Anelastic Backflow Following Stress Reductions During Creep of Pure Metals", Acta Materialia, vol. 29, pp. 1769–1784, 1981.

Tang, W.C., C.H. Nguyen, and R.T. Howe, "Laterally Driven Polysilicon Resonant Microstructures", Sensors and Actuators A, 20, pp. 25–32, 1989.

R.W. Hoffman, "Nanomechanics of Thin Films:Emphasis: Tensile Properties", Mat. Res. Soc. Symp. Proc. vol. 130, 1989 Materials Research Society, pp. 295–306.

* cited by examiner

APPARATUS AND METHOD FOR TESTING OF MICROSCALE TO NANOSCALE THIN FILMS

PRIORITY CLAIM

This application claims priority of U.S. Provisional Application No. 60/318,817, filed Sep. 12, 2001, under 35 U.S.C. §119.

STATEMENT OF GOVERNMENT INTEREST

The present invention was made with Government assistance under NSF Career Grant ECS 97-34368. The Government has certain rights in this invention.

FIELD OF THE INVENTION

A field of the invention is material testing of microscale and nanoscale films.

BACKGROUND OF THE INVENTION

As part of micro-electronic and micro-electro-mechanical systems (MEMS), thin films experience extrinsic loads due to operational and environmental conditions of the devices, and may fail to maintain mechanical integrity, as observed by cracking, delamination, and void or hillock formation under stresses. Accurate prediction of thin film material response requires understanding of the fundamental mechanisms of material deformation and fracture occurrence in the microscale and nanoscale. Material properties typically cannot be extrapolated from their respective bulk values since material behavior often is not only different in the microscale, but is also significantly affected by fabrication processes, and is very sensitive to the influences of interfaces and adjoining materials.

Various material properties tests require tensile loading of a specimen. For example, one popular testing method for both bulk and thin film materials is the uniaxial tensile test. This basically involves gripping a specimen at opposing ends, and producing tension in the specimen along a single axis while measuring the specimen's response. When loading thin film materials, however, certain challenges are involved, such as: fabricating a freestanding specimen with minimal pre-stress; gripping of the specimen; aligning of the specimen in the direction of the force (to minimize likelihood of invalidation of the test caused by flexural stress on the specimen and resultant premature failure); and generating small forces (on the order of micro-Newtons) with high resolutions.

These challenges can be addressed by using a substrate layer that is usually very compliant and with known material properties along with the actual film to be tested. However, introduction of the substrate complicates the experimental analysis because the microscale material properties of the substrate itself may not be known accurately, and because the interface with the substrate may influence the mechanical behavior of the film.

For example, a method of fabricating freestanding aluminum films includes evaporating metal film on a glass slide covered with a water-soluble layer, releasing the thin film from the glass slide by immersing it in water, and gluing the film to grips of a nano-tensilometer with epoxy. However, problems of mounting the specimen and premature specimen failure invalidate a significant number of tests using this method, and experimental results from the tests have shown significant variation in measured elastic modulus and ultimate tensile strength.

Another prior fabrication technique includes sputtering metal films on glass slides and releasing the films by peeling the films off from a substrate. A motor-driven micrometer is used to produce elongation in the films, and a load cell is used to read the stress. Laser spots diffracted from the gratings on the specimen surface determines the strain with 0.002% resolution.

Another known method produces a piezo-actuated tensile testing apparatus using Ti—Cu—Ti multilayer films with a length of 700 microns, a width of 200 microns, and a total thickness of 1.2 $\mu$m patterned on wafers by lithography. The films are then released from the substrate by wet etching of the substrate. This tensile testing apparatus has been known to provide force and displacement resolutions of about 200 $\mu$N and 20 nm, respectively. Still another testing method uses piezoelectric actuators for displacement and a load cell, a laser interferometer, and a strain gauge-optical encoder assembly to measure force and displacement.

SUMMARY OF THE INVENTION

The present invention provides a method and apparatus for testing of a thin-film specimen. A chip includes a free-spanning specimen to be tested. The specimen is co-fabricated with the remainder of the chip and is aligned with a longitudinal direction of the chip, along a tensile axis. The chip includes a first end, a second end, and one or more side beams. A force sensor beam supports a first longitudinal end of the specimen, and a support structure supports a second longitudinal end of the specimen.

The support structure may include a longitudinal beam connected to the second longitudinal end of the specimen and aligned with the tensile axis of the specimen. Additionally, the support structure may include a plurality of support beams to reduce undesirable flexing of the specimen resulting from misalignment of the pulling direction with the tensile axis of the specimen. Preferably, the chip includes a pair of structural springs fabricated for maintaining structural integrity between the first and second ends of the chip. The chip may additionally include markers to measure displacement of longitudinal ends of the specimen and deflection of the force sensor beam.

In a preferred method of testing a thin film specimen, a chip is provided that is co-fabricated with the specimen, and first and second ends of the chip are mounted to first and second sections, respectively, of a straining stage within an environmental chamber. The straining stage is actuated to move the first section of the straining stage away from the second section, thus pulling the first and second ends of the chip along a pulling or displacement direction and straining the gauge length of the specimen generally along the tensile axis.

DETAILED DESCRIPTION OF THE INVENTION

The present invention provides a method and apparatus for tensile testing of a thin-film specimen, allowing testing of the specimen in-situ within a number of testing environments, such as, but not limited to, a chamber such as a scanning electron microscope (SEM) or transmission electron microscope (TEM) chamber. The chip can be fabricated using microfabrication techniques so that the chip is small enough to be placed within a TEM or SEM chamber without modification, allowing both qualitative and quantitative in-situ experimentation of a thin-film specimen on a microscale or nanoscale. The chip may be used for a variety of tests requiring tensile loading of a specimen, such as testing of uniaxial tension, tension-tension fatigue, electrical resistance under stress, and low and high temperature creep, among others. Materials that can be tested include metals, dielectrics, and multi-layer composites that can be deposited or grown on a silicon substrate. The invention is particularly useful for probing microscale or nanoscale material behavior, where the deformation characteristics are expected to deviate significantly from associated bulk values. An inventive method for fabricating a testing chip allows testing of a free-spanning specimen, while substantially reducing the likelihood of premature failure of the specimen. According to a preferred apparatus and method of the invention, a single chip includes the specimen, as well as one or more testing elements that may include mechanisms for gripping the specimen, measuring force and displacement of the specimen, correcting for misalignment, and accounting for residual pre-stress in the specimen.

An embodiment of the present invention includes an individual tensile testing chip that includes a free-spanning specimen to be tested. The specimen is co-fabricated with the remainder of the chip, including one or more testing elements, and is aligned with a longitudinal direction of the chip, along a tensile axis. The chip includes a first end, a second end, and one or more side beams. A deformable force sensor beam supports a first longitudinal end of the specimen and a support structure supports a second longitudinal end of the specimen. The specimen is preferably gripped at its first and second longitudinal ends by adhesion to a substrate material of the chip; therefore, only the gauge length part is strained. A separate gripping mechanism is not required.

In a preferred application of the tensile testing chip, the first and second ends of the chip are mounted to first and second ends, respectively, of a straining stage within an environmental chamber such as a TEM or SEM chamber. The chip may be mounted to the straining stage by suitable adhesive, and/or mounting holes may be formed on the first and second ends of the chip for mounting to the straining stage. The straining stage may be actuated by known or to be known actuators, such as piezo-actuators, to move the first section of the straining stage away from the second section, thus pulling the first and second ends of the chip away from one another. This strains the gauge length of the specimen generally along the tensile axis.

The chip preferably further includes at least first and second markers for determining elongation of the specimen and deflection of the force sensor beam, for quantitative testing analysis. The first marker detects displacement of the force sensor connected to the first longitudinal end of the specimen, and the second marker detects displacement of the second longitudinal end of the specimen. By measuring and comparing displacement of both the first and second markers, one can calculate the elongation of the specimen. Also, because materials having known properties can be selected for the substrate, one can calculate the stress applied to the specimen based on the measured displacement of the first marker.

The support structure may include a longitudinal beam connected to the second longitudinal end of the specimen and aligned with the tensile axis of the specimen. Additionally, the support structure may include a plurality of support beams to substantially reduce undesirable flexing of the specimen resulting from any misalignment of the pulling (loading) direction with the tensile axis of the specimen. Preferably, the chip includes a pair of structural springs fabricated for maintaining structural integrity between the first and second ends of the chip.

Figure 1:
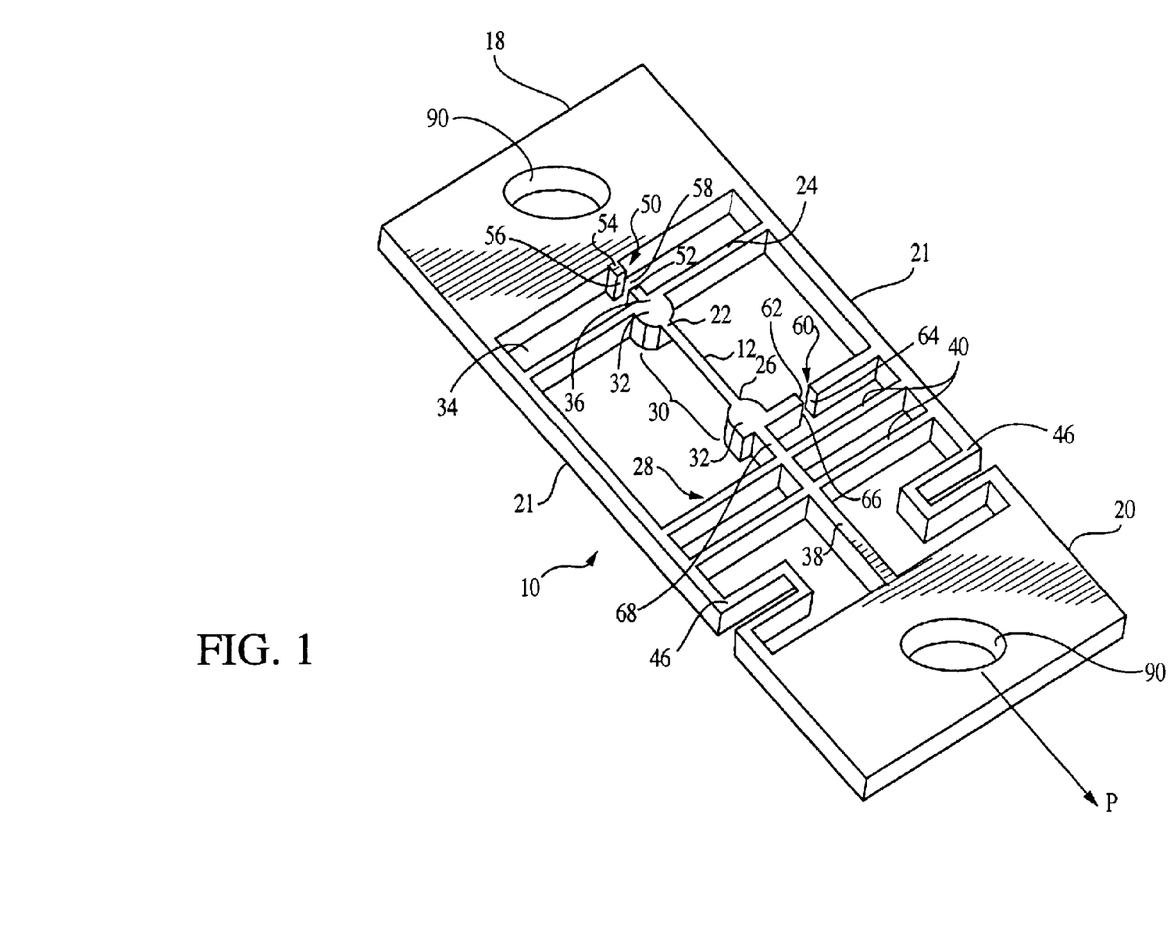
FIG. 1 is a schematic perspective view of a tensile testing chip according to a preferred embodiment of the invention.

Turning now to the drawings, FIG. 1 shows a tensile testing chip 10 in accordance with a preferred embodiment of the present invention. The individual, fabricated chip 10 includes a specimen 12 to be tested co-fabricated with the remainder of the chip. The chip 10, preferably including silicon substrate material, includes a first end 18, a second end 20, and one or more side beams 21. During testing, the first end 18 is separated from the second end 20 (for example, by a straining stage) during tensile loading of the specimen 12. For example, the first end 18 as shown in FIG. 1 may be a fixed end, and the second end 20 may be a moving end intended to be pulled away from the first end 18 in a pulling or displacement direction P. Alternatively, the second end 20 may be held fixed while the first end 18 is moving, or both ends may be pulled apart during loading.

The central part of the testing chip 10 is the free-spanning thin-film specimen 12, which is laterally positioned centrally within the chip 10 and extends longitudinally along a tensile axis, which, in the example chip shown in FIG. 1, is coaxial with the pulling or displacement direction P. The free-spanning specimen 12 is supported at a first longitudinal end 22 by a deformable force sensor beam 24. The force sensor beam 24 is configured to deflect in response to a tensile stress on the specimen 12. A second longitudinal end 26 of the specimen 12 is supported by a support structure 28. The force sensor beam 24 and the support structure 28 may support the specimen 12 either directly or indirectly. In operation of the tensile testing chip 10, tensile force is applied on the specimen 12 by pulling the first end 20 of the chip away from the first end 18. The resulting displacement is transmitted to the deformable force sensor beam 24 by the specimen 12 itself, causing a deflection in the force sensor beam.

Gripping of the specimen 12 is due to adhesion between the specimen material and an underlying substrate material during fabrication of the chip 10. Thus, a separate gripping mechanism for the specimen 12 is not necessary. In case of poor adhesion between materials, a thin, adhesion-promoting intermediate layer (not shown), can be applied to the substrate material, except for a gauge length 30 of the specimen 12. For example, between a gold specimen and a silicon substrate material, a chromium or titanium layer may be formed. A pair of pads 32 is preferably fabricated on the chip 10, connected to the force sensor beam 24 and the support structure 28 and contacting the first and second longitudinal ends 22, 26 of the specimen 12. The pads 32 create a greater area for adhesion with the first and second longitudinal ends 22, 26 of the specimen 12, and anchor the free-spanning specimen 12.

The deformable force sensor beam 24 preferably extends laterally across the chip 10, for example between the side beams 21, and positioned longitudinally between the specimen 12 and the first end 18. The force sensor beam 24 preferably is separated from the first end by an opening 34 formed in the chip 10 where material is removed during fabrication. The opening 34 allows greater deflection of the force sensor beam 24. Preferably, the force sensor beam 24 is configured to allow in-plane deflections only. The specimen 12 preferably is located on the chip 10 such that the tensile axis is aligned with a lateral center 36 of the force sensor beam 24. In this way, deflection of the center 36 of the beam 24 accurately represents the stress of the beam and displacement of the first end 22 of the specimen 12.

The support structure 28 supporting the second longitudinal end 26 of the specimen 12 preferably includes a longitudinal beam 38 extending along the tensile axis between the second end 20 of the chip 10 and the specimen. The longitudinal beam 38 transmits the displacement between the first end 18 and the second end 20 to the specimen 12. For correcting load misalignment between the pulling or displacement direction P and the tensile axis of the specimen 12, the support structure 28 preferably further includes one or more support beams 40 connected to the longitudinal beam 38 and to the side beams 21. The longitudinal beam 38 may be disposed to generally laterally bisect the support beams 40. Though the exemplary chip 10 of FIG. 1 shows two laterally extending, straight support beams 40, the support beams may vary in number and configuration to allow for correction of misalignment. Accordingly, the support structure 28 including the support beams 40 of the inventive chip 10 is not intended to be limited to the configuration shown. It is strongly preferred, however, that a plurality of the support beams 40 is included in the support structure 28, which allows pure tensile stress to be applied to the specimen 12.

Figure 2:
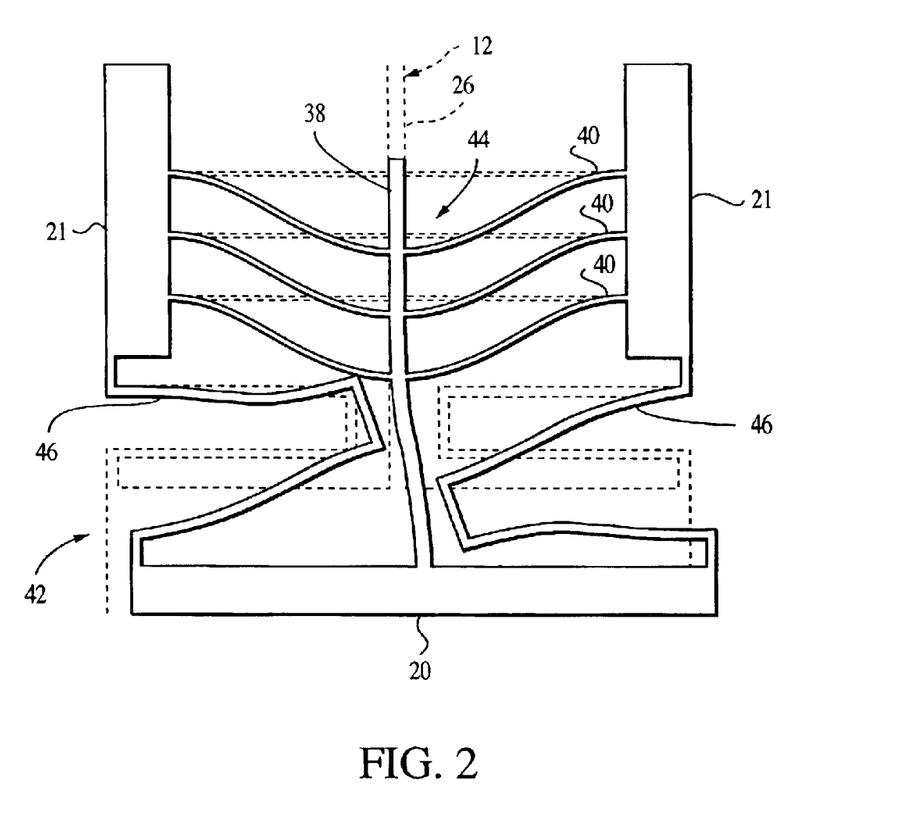
FIG. 2 is a schematic top plan view of a tensile testing chip having a specimen in undeformed and deformed states.

The support beams 40 substantially reduce bending load on the specimen 12 by producing a counter-moment to any off-axis force component. As a result, the displacement imposed to the specimen 12 is essentially along the tensile axis only, transmitted through the longitudinal beam 38. For example, FIG. 2 shows a portion of a second chip 42 having a support structure 44 with three laterally extending support beams 40, depicting the specimen 12 and the support structure in undeformed (shown in dashed lines) and deformed (solid lines) states. In a finite element method (FEM) study carried out by the present inventors with the tensile test chip 42, a fixed boundary condition is applied to the first end (not shown in FIG. 2) of the chip, while the second end 20 of the chip (shown at the bottom) is given a prescribed displacement of 30 µm along the tensile axis direction of the specimen 12 and 10 µm along the lateral direction. This is equivalent to an 18° error in alignment of the specimen 12 with the tensile axis, which displacement should be readily observed by human eyes. The results obtained by the present inventors predict that the rotation of the second longitudinal end 26 of the specimen 12 is only $1.33 \times 10^{-5}$ degrees, i.e. the exemplary test chip having the support beams 40 reduces an 18° loading alignment error by six orders of magnitude. One skilled in the art will appreciate that various configurations are possible for the support structure 28, including the support beams 40, and that the structures shown are for purposes of illustration only.

Preferably, the chip 10 includes a pair of springs such as U-shaped springs 46, for example, on the side beams 21 at each lateral side or elsewhere on the chip, for maintaining structural integrity between the first and second ends 18, 20 of the chip. As shown in FIG. 2, the springs 46 deform when the first end 18 and the second end 20 are pulled apart during actuation, and thus substantially prevent the side beams 21 between the springs and the first end 18 from deforming. This facilitates transmission of the displacement between the ends 18, 20 along the longitudinal beam 38 to the specimen 12. It will be appreciated that other configurations for the springs may be used as well.

For measuring the stress of the force sensor beam 24 and displacement of the first longitudinal end 22 of the specimen 12, a first marker 50 is fabricated onto the chip 10. In the chip 10 of FIG. 1, the first marker 50 includes a projection 52 extending longitudinally from the lateral center 36 of the force sensor beam 24 and facing a projection 54 extending longitudinally in the opposite direction, from the first end 18 of the chip 10. An end 56 of the projection 54 extending from the first end 18 provides a reference point for measuring displacement of the projection of the force sensor beam 24. By determining a change in relative longitudinal location of the projections 52, 54 by measuring a change in longitudinal distances of a gap 58 defined between the projections, one can determine the displacement of the center 36 of the force sensor beam 24.

The support structure 28 may also be fabricated with a second marker 60 at or near the connection between the support structure and the second end 26 of the specimen 12 to determine a displacement of the second end. A projection 62 extends laterally from the pad 32 connecting the second end 26 of the specimen 12 to the remainder of the chip 10, and towards the side beam 21. Another projection 64 extends from one of the side beams 21 laterally toward the projection 62 to provide a longitudinal reference point. The projections 62, 64 are preferably separated by a second gap 66. By measuring a change in relative longitudinal location between the projections 62, 64, one can measure the displacement of the second end 26 of the specimen 12. To avoid interference with operation of the second marker 60 by the support beams 40, the second end 26 of the specimen 12 may be longitudinally separated from the support beams by a portion 68 of the longitudinal beam 38. One skilled in the art will appreciate that various configurations are available for the markers 50, 60 with same or different methods of showing displacement.

Using the measured displacement from the first and second markers 50, 60, one can determine the stress and strain on the specimen 12 during actuation of the chip 10. From the spring constant k and the measured displacement δ of the force sensor beam 24 (from the first marker 50), the force F on the specimen 12 is evaluated as F=kδ. The spring constant k is calculated from the following equation:

$$k = \left(\frac{24EI}{L^3}\right)$$

where L is half the total lateral length of the force sensor beam 24, E is the elastic modulus of the beam material, and I is the moment of inertia from the beam cross-section. If, as preferred, the force sensor beam 24 is preferably made from a substrate material of single crystal silicon along (110) crystal direction, the value of E is known accurately. A more accurate value of the spring constant can be found by calibrating the force sensor beam 24 with a nanoindenter.

The force resolution thus depends on the spring constant of the force sensor beam 24 and the resolution of the measurement of displacement δ. The gaps 58, 66 defined by the first and second markers 50, 60 read the displacements of both ends 22, 26 of the specimen 12. The reading of the first marker gap 58 gives the displacement δ of the force sensor beam 24. The relative displacement between the first and second markers 50, 60 gives the elongation of the specimen 12, which is subsequently used to compute the strain associated with the stress value.

FIGS. 3A–3H show steps in a preferred process for manufacturing a tensile testing chip with a thin film aluminum specimen. Though aluminum is used as an example specimen material, the specimen can be of any material or combination of materials that can be grown, sputtered, evaporated, etc. on silicon or other material wafer and patterned using microfabrication techniques.

Figure 3A:
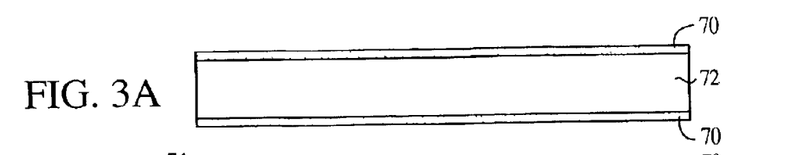
FIG. 3 is a schematic sectional view showing steps in a preferred method of fabricating a tensile testing chip.
Figure 3B:
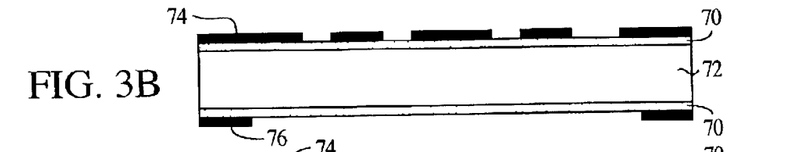
Figures 3C, 3D:
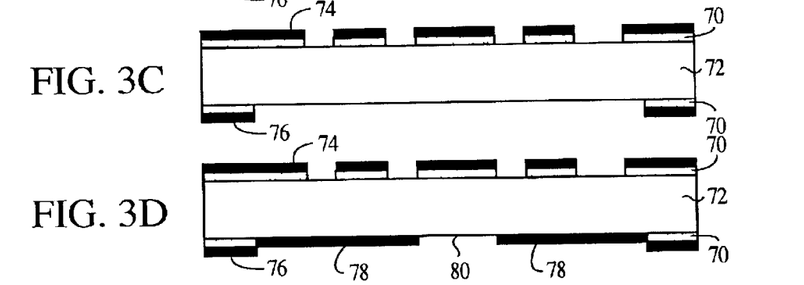
Figure 3E:
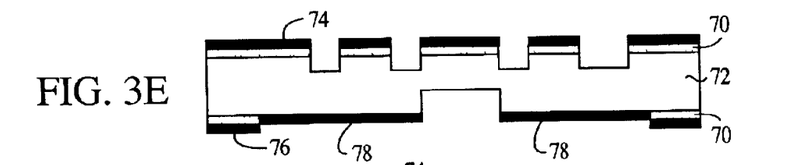
Figure 3F:
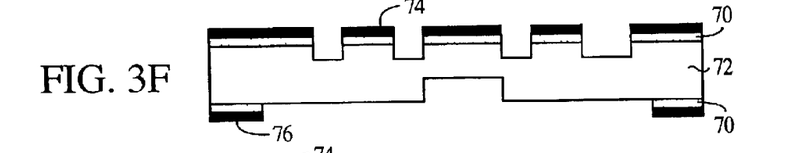
Figure 3G:
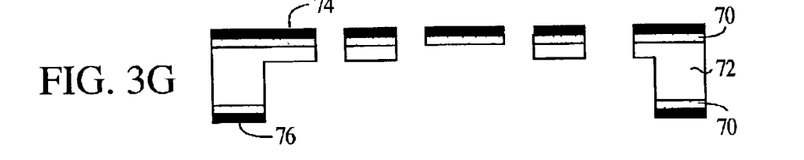

First, as shown in FIG. 3A, a thin film material 70, such as aluminum, is deposited on both sides of a wafer 72, preferably by sputtering. It is preferred that single crystal silicon is used for the material of the wafer 72. If the specimen material 70 does not adhere well to the wafer (substrate) material 72, a thin (for example, 5 nm) intermediate layer (not shown) may be deposited on the wafer before deposition of the specimen material. As shown in FIG. 3B, the tensile testing chip is patterned onto the thin film material 70, preferably with a photoresist 74, for example AZ 1518, on the front side of the wafer, and a mask 76 is formed on the back side of the wafer to define the underside of the chip. The patterned testing chip includes patterns for forming the specimen 12, the first and second ends 18, 20, the side beams 21, and one or more structural beams 71 (see FIG. 3H). The structural beams include beams for forming testing elements such as, but not limited to, the force sensor beam 24, the beams of the support structure 28, such as the longitudinal beam 38 and the support beams 40, the markers 50, 60, the springs 46, or other elements or features. After patterning, the deposited, unmasked aluminum layer 70 is selectively removed (FIG. 3C), preferably by etching, on both sides of the wafer 72. Next, a photoresist etching mask 78 is patterned on the back side, as shown in FIG. 3D. The etching mask defines a gap 80 aligned to cover exactly the gauge length 30 of the specimen 12.

Figure 3H:
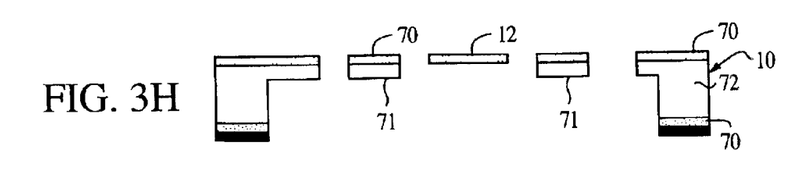

After the gauge length 30 of the specimen 12 is defined, unmasked wafer material 72 from both the front side (around patterned structures of the test chip) and the back side (aligned with the gap 80) is removed (FIG. 3E) to a particular depth, such as 100 microns, preferably by deep reactive ion etching (DRIE). or other etching processes. The photoresist 78 on the back side then is removed (FIG. 3F), preferably by $O_2$ plasma etching or other dry etching, to expose most of the back side of the wafer 72. Next, unmasked wafer material 72 is removed from the back side, preferably by etching, such as dry etching, through the wafer, (FIG. 3G) to release the free-spanning specimen 12 along the gauge length 30 and produce the chip 10, including the first end 18, second end 20, side beams 21, and the structural beams 71. Finally, as shown in FIG. 3H, the remaining layer of photoresist 74 is removed from the front side of the wafer 72. A coating of the specimen material 70 preferably remains on the wafer after fabrication.

The specimen 12 is co-fabricated with the remainder of the chip 10, including one or more testing elements. The inventive method allows fabrication of the free-spanning specimen 12, without an (undesirable) underlayer under the gauge length 30, and significantly reduces occurrences of failure of the specimen during fabrication of the chip 10 and release of the specimen. Accordingly, the free-spanning specimen 12, along with mechanisms for gripping of the specimen (through adhesion between the wafer material 72 and the specimen material 70, preferably at the pads 32), generating displacement of the specimen, and maintaining alignment of the forces on the specimen, among other features, are co-fabricated onto the individual chip 10.

During film growth of the tensile testing specimen 12 on the wafer 72, the thin-film material 70 may develop tensile residual stresses. These stresses may be relieved by curling or wrinkling of the specimen 12 upon release, which undesirably affects the results of tensile testing experiments. The present chip 10 has the capability to measure and account for the residual tensile stress of the pre-stressed specimen 12. Since the first longitudinal end 26 of the specimen 12 is attached to the deformable force sensor beam 24, any pre-stress in the specimen can be detected by measuring the displacement of the force sensor beam. This displacement is easily measured by reading the first marker 50 before the experiment and after fracture of the specimen 12.

The fabricated tensile test chip 10 is designed to fit in various testing environments, including, but not limited to, TEM or SEM straining stage where one end of the chip is pulled by a motor or other actuation mechanism. The chip 10 may be glued to the straining stage. Alternatively, holes 90 may be provided on the chip 10, such as at the ends 18, 20, to fit mounting pins of the straining stage. The overall size of the chip 10 preferably depends on the design of its intended environment, for example the design of an in-situ TEM or SEM straining stage. In an exemplary tensile testing chip 10 fabricated by the present inventors, the chip measured 3 mm by 10 mm, with a thickness of 100 μm. These dimensions allow the exemplary testing chip 10 to be fitted within a typical TEM or SEM straining stage, though it will be appreciated that these dimensions can vary. It will be appreciated that the chip may be used in various controlled environments, such as environmental chambers of TEM, SEM, or optical microscopes, or environments with or without testing chambers.

In an exemplary operation of the testing chip 10, the present inventors fitted a chip to a JEOL 4000 TEM straining stage equipped with an environmental cell. The first end 18 of the tensile test chip 10 is glued to a fixed column of the straining stage, and the second end 20 of the chip is glued to an actuator, which is mounted to the fixed column. The actuator used for the exemplary operation is a piezo-actuator, though an experiment may be set up with other actuators to produce displacement. Alternatively, the chip 10 may be co-fabricated with electrostatic (MEMS) actuators to provide the displacement. The maximum displacement provided by the piezo-actuator in this exemplary setup is 18 μm at 150 V.

The force resolution of the test chip 10 depends primarily on the spring constant k of the force sensor beam 24 and resolution of the measurement of the displacement δ of the force sensor beam. For the force sensor beam 24 used in the experiment, the spring constant value k is 182 N/m, and assuming 100 nm displacement shown by the first marker 50 can be read easily with an SEM or TEM, the force resolution is 18.2 μN.

The tensile testing chip 10 was fabricated with a pure aluminum specimen 12, 185 microns long, 23.5 microns wide, and 200 nanometers thick. The force sensor beam 24 was 2.10 mm in total length, 18.5 microns wide, and 100 microns deep, with a spring constant k=182.24 N/m. The chip 10 was loaded onto the straining stage, and the setup was mounted in a Phillips environmental SEM (ESEM), where a wide range of relative humidity and temperature can be maintained inside the chamber.

Figure 4:
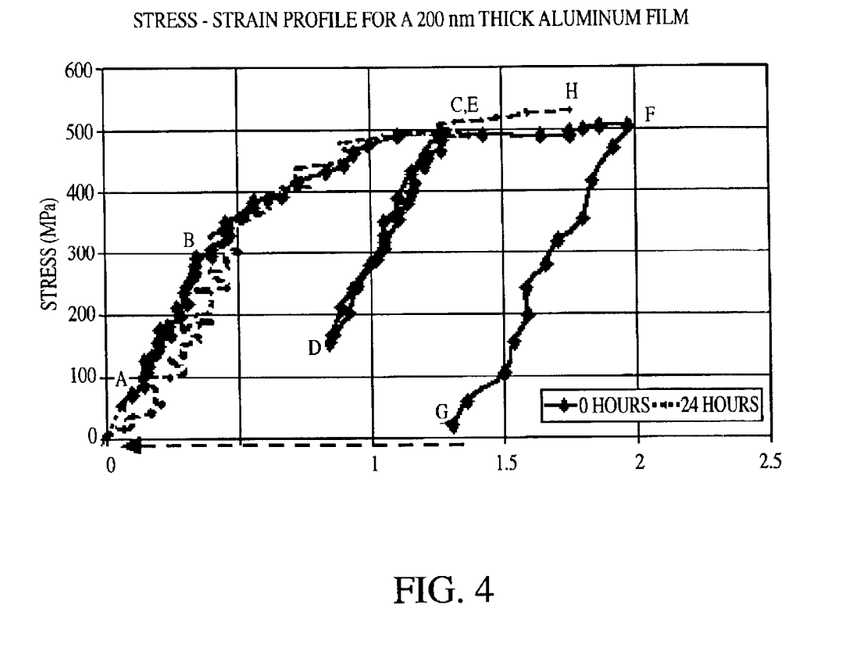
FIG. 4 is a chart showing a stress-strain profile for a free-spanning 200 nanometer thick aluminum film produced by a tensile test according to a preferred testing chip and method of the present invention.

The specimen 10 was loaded and unloaded in three cycles. FIG. 4 shows the engineering stress-strain plot for the 200 nm thick aluminum film. The specimen 12 had a tensile residual stress, which might have arisen during deposition of the film material 70, and/or during curing of the glue used to bond the chip 10 with the piezo-actuator and the fixed column. The amount of pre-stress on the specimen 12 was calculated by comparing the first marker 50 reading just before and after the experiment. From this comparison, the residual stress was found to be 69 MPa, which is well below the yield stress of the film. As shown in FIG. 4, the loading begins from point A, which represents the pre-stress of 69 MPa.

The stress-strain response is linear from point A to point B. The elastic modulus is calculated from the slope of A–B and was found to be 76 GPa. This modulus is different from the bulk value modulus of 70 GPa. However, the presence of a layer (3 to 5 nanometers) of native oxide formed by corrosive aluminum oxide on all sides of the aluminum thin film specimen 12 likely had some effect on this value. The elastic modulus E of the thermally evaporated oxide ($Al_2O_3$) on an aluminum substrate has previously been determined to be in the range of 65 to 95 GPa. This range of values is somewhat close to the value of the aluminum itself, which suggests that the effect of the native oxide on the specimen's elastic modulus is negligible. The specimen 12 yielded at point B at about 330 MPa, which is about 19 times the yield stress of bulk aluminum of commercial purity.

Further loading up to point C shows strain hardening effect in the specimen 12. The strain hardening part of the stress-strain diagram can be described by the power law $\sigma = A\epsilon^n$, where A=564 and n=0.5. The corresponding values for bulk pure aluminum are 120 and 0.2 respectively. The specimen 12 was then unloaded to point D, and then reloaded to point E. The unloading and reloading behavior was linear elastic, and produced the same elastic modulus (76 GPa). The specimen 12 became plastic at point E (very close to the unloading point C), and it reached about 1.9% strain without any significant increase in stress.

The specimen 12 was continuously monitored in the SEM chamber and no sign of curling, necking, cracking, or creep was observed up to this point. At point F, the specimen 12 was unloaded and linear elastic behavior was observed with almost the same slope value (75 GPa). As the test chip 10 was unloaded, the second marker 60 came back to the original position (the position before the experiment started), and the plastic strain induced in the specimen 12 caused it to buckle. The gap 58 of the first marker 50 was recorded, which is considered as the load-free state of the force sensor beam 24, and is used to calculate the stresses on the specimen 12 (including the initial residual stress). The critical buckling force for the specimen 12 is:

$$P_{cr} = \frac{4\pi^2 EI}{L^2}$$

which is about 16 $\mu$N. The corresponding stress is only 3.5 MPa, which is negligible compared to the stresses applied on the specimen 12 during the experiment.

After about twenty-four hours, the specimen 12 was reloaded. One would expect that upon loading, the force sensor beam 24 would not displace until the previously buckled film is straightened up. However, during the experiment, the force sensor beam 24 displaced immediately as the reloading began, which implies that the specimen 12 recovered almost all the plastic deformation in room temperature. This is shown in the stress-strain diagram in FIG. 4 by a dotted line along the x (strain) axis. The amount of such recovery depends on the temperature, and a smaller amount was expected in the study since the specimen 12 was in room temperature. At the same time the grain size effect on the recovery may enhance the amount of plastic strain recovered for finer grains. With continued loading, the specimen 12 showed linear elastic behavior, with a reduced elastic modulus of 53.2 GPa. The yield stress and the strain hardening parameters for the continued loading cycle were found to be the same as the first loading cycle.

Upon continued loading, curling of the specimen 12 was observed. After strain hardening up to 529.3 MPa, and 1.8% strain (point H), a crack was observed for the first time. The crack initiated at the edge of the specimen 12. At this point further displacement of the test chip 10 was stopped by keeping the voltage of the piezo-actuator fixed. The crack propagation continued, leading to fracture of the specimen 12 in about 3 minutes. The stress concentration at the crack tip triggered growth of voids ahead of the crack tip and at about a 45° angle to the tensile axis. The crack continued to grow by coalescence of the microvoids. After 3 minutes, the crack starting growing normal to the loading axis, leading to catastrophic failure.

One skilled in the art will appreciate that a method and apparatus for specimen testing has been shown and described, which provides a number of benefits. The inventive chip 10 allows testing of free-spanning single or multilayered thin film specimens 12 of any thickness, and specific force and resolution requirements can be met by proper choice of the width, depth, and/or length of the force sensor beam 24. The chip 10 provides an integrated solution for gripping a free-spanning specimen 12 for testing, measuring force and displacement of the specimen, minimizing misalignment in force application (allowing for true uniaxial testing), and measuring and accounting for residual pre-stress in the specimen.

In addition, the relatively small setup size possible for the chip 10 enables quantitative and qualitative in-situ testing inside a testing environment, including an SEM or even a TEM chamber. This helps not only to determine material properties, but also to understand mechanisms governing micro-scale behavior from direct observation. By performing the experiments inside an environmental cell SEM or TEM or other microscope, such as an optical microscope, for example, one can test the effect of environmental conditions using the inventive chip 10.

The chip 10 provides a measuring tool for mechanical properties of micron- and submicron-scale thin film materials in uniaxial tension. Furthermore, the chip 10 can be used to perform other tests on thin films under tensile loading. For example, the effect of mechanical stress on the electrical properties of thin films (such as change of resistance) can be examined by flowing a current through the specimen 12. It can also be used to perform tension-tension fatigue tests by co-fabricating the specimen 12 with an electrostatic comb drive actuator, or to measure low and high temperature creep.

While various embodiments of the present invention have been shown and described, it should be understood that other modifications, substitutions, and alternatives are apparent to one of ordinary skill in the art. Such modifications, substitutions, and alternatives can be made without departing from the spirit and scope of the invention, which should be determined from the appended claims.

What is claimed is:

1. A chip for thin-film testing comprising:
   first and second opposing ends along a longitudinal direction of the chip and side beams disposed at lateral ends of the chip;
   a free-spanning thin-film specimen between said first and second ends, said specimen being aligned with said longitudinal direction of the chip and along a tensile axis, said specimen having a first longitudinal end and a second longitudinal end;
   a deformable force sensor beam supporting said first longitudinal end of said specimen;
   a support structure supporting said second longitudinal end of said specimen.

2. A chip for thin-film testing comprising:
   first and second opposing ends along a longitudinal direction of the chip and side beams disposed at lateral ends of the chip;

a free-spanning thin-film specimen between said first and second ends, said specimen being aligned with said longitudinal direction of the chip and along a tensile axis, said specimen having a first longitudinal end and a second longitudinal end;

a deformable force sensor beam supporting said first longitudinal end of said specimen;

a support structure supporting said second longitudinal end of said specimen;

wherein said support structure comprises;

a longitudinal beam coaxial with said tensile axis of said specimen, said longitudinal beam being connected to said second end and said specimen at said second longitudinal end;

at least one support beam connected to said longitudinal beam.

3. The chip of claim 2 wherein said at least one support beam comprises a plurality of support beams extending laterally between said side beams.

4. A chip for thin-film testing comprising:

first and second opposing ends along a longitudinal direction of the chip and side beams disposed at lateral ends of the chip;

a free-spanning thin-film specimen between said first and second ends, said specimen being aligned with said longitudinal direction of the chip and along a tensile axis, said specimen having a first longitudinal end and a second longitudinal end;

a deformable force sensor beam supporting said first longitudinal end of said specimen;

a support structure supporting said second longitudinal end of said specimen;

wherein said force sensor beam includes a projection separated from a first reference point on said first end by a gap, wherein a relative location of said projection and said first reference point is used for determining displacement of said force sensor beam along said longitudinal direction.

5. The chip of claim 4 wherein said support structure includes a second projection separated from a second reference point on said chip, wherein a relative location of said second projection and said second reference point is used for determining displacement of said second end of said specimen.

6. The chip of claim 5 wherein said chip includes a projection at said first reference point and a projection at said second reference point.

7. A chip for thin-film testing comprising:

first and second opposing ends along a longitudinal direction of the chin and side beams disposed at lateral ends of the chip;

a free-spanning thin-film specimen between said first and second ends, said specimen being aligned with said longitudinal direction of the chip and along a tensile axis, said specimen having a first longitudinal end and a second longitudinal end;

a deformable force sensor beam supporting said first longitudinal end of said specimen;

a support structure supporting said second longitudinal end of said specimen;

wherein said side beams further comprise at least one deformable spring.

8. A method of providing a tensile load to a thin film material, the method comprising the steps of:

providing a chip including a first end, a second end, a free-spanning specimen of said thin film material having a first longitudinal end and a second longitudinal end, a force sensor beam supporting said first longitudinal end, and a support structure supporting said second longitudinal end;

attaching said first end to a first section of a straining stage and said second end to a second section of said straining stage;

actuating said straining stage to separate said second section from said first section, separating said second end of said chip from said first end along a displacement direction;

determining a displacement of said force sensor beam along said displacement direction;

determining a displacement of said second end of said specimen.

9. The method of claim 8 wherein said step of determining said displacement of said force sensor beam includes the step of determining a change in separation distance between a first projection of said force sensor beam and a reference point on said chip.

10. The method of claim 8 wherein said step of determining said displacement of said second end includes the step of determining a change in separation distance between a second projection connected to said second end of said specimen and a reference point on said chip.

11. The method of claim 10 further comprising the step of:

using said determined displacement of said force sensor beam, determining a stress applied to said specimen.

12. The method of claim 11 further comprising the step of:

using said determined displacement of said force sensor beam and said determined displacement of said second end of said specimen, determining an elongation of said specimen.

13. The method of claim 8 wherein said step of attaching said first end and said second end comprises the step of gluing said first and second ends to said straining stage.

14. The method of claim 8 wherein said step of attaching said first end and said second end comprises the step of mounting said first end and said second end with mounting pins inserted through apertures on said first end and said second end.

15. A method of fabricating a chip for testing a thin film, the method comprising the steps of:

co-fabricating a specimen of a material of the thin film with one or more structural beams of the chip;

releasing said specimen and said structural beams.

16. The method according to claim 15 wherein said step of co-fabricating comprises the steps of:

depositing a material of the thin film on a wafer;

patterning the chip, including said specimen and said one or more structural beams, on said wafer.

17. The method according to claim 16 wherein said step of releasing comprises the step of:

selectively removing material of said wafer to release said specimen and said structural beams.

18. The method of claim 17 wherein said wafer material comprises single crystal silicon.

19. A method of fabricating a chin for testing a thin film, the method comprising the steps of;

co-fabricating a specimen of a material of the thin film with one or more structural beams of the chip;

releasing said specimen and said structural beams;

wherein said step of co-fabricating comprises the steps of:

depositing a material of the thin film on a wafer; and patterning the chip, including said specimen and said one or more structural beams, on said wafer;

wherein said step of patterning the chip comprises the step of:

patterning a first mask on said front side of said wafer for patterning a specimen and a plurality of structural beams.

20. The method according to claim 18 wherein said step of selectively removing material of said wafer further comprises the steps of:

patterning a second mask on said back side defining a gap aligned with a gauge length portion of said specimen;

selectively removing said material of said wafer to a predetermined depth on said front side and said back side;

selectively removing said second mask;

removing material of said wafer from said backside to release said specimen along said gauge length portion, and said plurality of structural beams.

21. The method of claim 20 wherein said step of releasing said specimen produces a free-spanning specimen.

22. A method of fabricating a chip for testing a thin film the method comprising the steps of:

co-fabricating a specimen of a material of the thin film with one or more structural beams of the chip;

releasing said specimen and said structural beams;

wherein said step of co-fabricating comprises the steps of:

depositing a material of the thin film on a wafer; and patterning the chip, including said specimen and said one or more structural beams, on said wafer;

wherein said step of releasing comprises the step of:

selectively removing material of said wafer to release said specimen and said structural beams;

wherein said step of selectively removing material of said wafer comprises the steps of:

selectively removing said material of said wafer on said front side and a back side of said wafer.

23. The method of claim 22 wherein said step of removing said wafer material on said front side and said back side includes the step of:

performing deep reactive ion etching (DRIE).

24. A method of fabricating a chip for testing a thin film, the method comprising the steps of:

co-fabricating a specimen of a material of the thin film with one or more structural beams of the chip;

releasing said specimen and said structural beams;

wherein said step of co-fabricating comprises the steps of:

depositing a material of the thin film on a wafer; and patterning the chip, including said specimen and said one or more structural beams, on said wafer;

wherein said step of depositing includes sputtering said thin film material onto said front side and back side of said wafer.

25. A method of fabricating a chip for testing a thin film, the method comprising the steps of:

co-fabricating a specimen of a material of the thin film with one or more structural beams of the chip;

releasing said specimen and said structural beams;

wherein said step of co-fabricating comprises the steps of:

depositing a material of the thin film on a wafer; and patterning the chip, including said specimen and said one or more structural beams, on said wafer;

wherein said step of releasing comprises the step of:

selectively removing material of said wafer to release said specimen and said structural beams;

wherein said step of patterning said specimen and said structural beams includes the step of:

patterning a first end, a second end, a plurality of side beams, said specimen, a force sensor beam connected to a first longitudinal end of said specimen, and a support structure connected to a second longitudinal end of said specimen.

26. A chip for tensile loading of a thin film material, the chip comprising:

a specimen of the thin film material disposed longitudinally between first and second ends and laterally between a pair of side beams;

a support structure supporting a longitudinal end of said specimen and connected to at least one of said first and second ends and said side beams;

said support structure including a substantially longitudinal beam supporting said longitudinal end of said specimen and a plurality of support beams connecting said substantially longitudinal beam and at least one of said first and second ends and said side beams.

27. The chip of claim 26 wherein said plurality of support beams comprise at least three beams.

28. The chip of claim 27 wherein each of said plurality of support beams extends laterally between said side beams.

29. A chip for tensile loading of a thin film material, the chip comprising:

a specimen of the thin film material disposed longitudinally between first and second ends and laterally between a pair of side beams;

a support structure supporting a longitudinal end of said specimen and connected to at least one of said first and second ends and said side beams;

said support structure including a substantially longitudinal beam supporting said longitudinal end of said specimen and a plurality of support beams connecting said substantially longitudinal beam and at least one of said first and second ends and said side beams; wherein said plurality of support beams comprise at least three beams;

wherein each of said plurality of support beams extends laterally between said side beams;

wherein said substantially longitudinal beam generally laterally bisects each of said plurality of support beams.

30. A method of providing a tensile load to a thin film material, the method comprising the steps of:

providing a chip including a first end, a second end, a free-spanning specimen of said thin film material having a first longitudinal end and a second longitudinal end, a force sensor beam supporting said first longitudinal end, and a support structure supporting said second longitudinal end;

separating said second end of said chip from said first end along a displacement direction;

determining a displacement of said force sensor beam along said displacement direction;

determining a displacement of said second end of said specimen.

31. The method of claim 30 wherein said step of determining said displacement of said force sensor beam includes the step of determining a change in separation distance between a first projection of said force sensor beam and a reference point on said chip.

32. The method of claim 31 further comprising the step of:
using said determined displacement of said force sensor beam, determining a stress applied to said specimen.

33. The method of claim 32 further comprising the step of:
using said determined displacement of said force sensor beam and said determined displacement of said second end of said specimen, determining an elongation of said specimen.

34. A chip for thin-film testing comprising:
first and second opposing ends and side beams extending between said first and second ends;
a free-spanning thin-film specimen between said first and second ends, said specimen extending along a tensile axis, said specimen having a first end and a second end;
a deformable force sensor beam supporting said first end of said specimen;
a support structure supporting said second end of said specimen.

35. The chip of claim 34 wherein said support structure comprises:
a longitudinal beam coaxial with said tensile axis of said specimen, said longitudinal beam being connected to said second end of the chip and said specimen at said second end;
at least one support beam connected to said longitudinal beam.

36. The chip of claim 35 wherein said at least one support beam comprises a plurality of support beams extending laterally between said side beams.

37. The chip of claim 34 wherein said side beams further comprise at least one deformable spring.

* * * * *